United States Patent [19]
Sakata et al.

[11] Patent Number: 5,181,819
[45] Date of Patent: Jan. 26, 1993

[54] APPARATUS FOR PROCESSING SEMICONDUCTORS

[75] Inventors: Kazunari Sakata, Sagamihara; Katsumi Ishii, Kanagawa; Kenichi Yamaga, Sagamihara, all of Japan

[73] Assignee: Tokyo Electron Sagami Limited, Kanagawa, Japan

[21] Appl. No.: 772,836

[22] Filed: Oct. 8, 1991

[30] Foreign Application Priority Data

Oct. 9, 1990 [JP] Japan .................................. 2-273027
Oct. 17, 1990 [JP] Japan .................................. 2-278576
Oct. 17, 1990 [JP] Japan .................................. 2-278577

[51] Int. Cl.$^5$ ........................................... B65G 25/00
[52] U.S. Cl. ........................................ 414/217; 55/96; 55/385.2; 55/472; 454/187
[58] Field of Search .................. 55/96, 97, 355, 385.2, 55/467, 472, 500, 213; 98/31.5, 31.6, 34.5, 34.6, 36, 115.3

[56] References Cited

U.S. PATENT DOCUMENTS

| | | | |
|---|---|---|---|
| 3,944,405 | 3/1976 | Van Calsteren et al. | 98/115.3 X |
| 4,693,173 | 9/1987 | Saiki et al. | 55/385.2 X |
| 4,832,717 | 5/1989 | Peters | 98/115.3 X |
| 4,923,352 | 5/1990 | Tamuya et al. | 98/115.3 X |
| 5,042,997 | 8/1991 | Rhodes | 55/385.2 X |
| 5,059,079 | 10/1991 | Foulke et al. | 98/115.3 X |
| 5,064,337 | 11/1991 | Asakawa et al. | 98/115.3 X |

*Primary Examiner*—Charles Hart
*Attorney, Agent, or Firm*—Oblon, Spivak, McClelland, Maier & Neustadt

[57] ABSTRACT

A semiconductor processing apparatus comprises a main body having an air passage, a plurality of filter units connected in series with the air passage in the main body, each filter unit having an air intake port, an air otlet port and an air blower, the air intake port of each filter unit communicating with the air outlet ports of the filter units disposed upstream side of the air passage, and a mechanism for arranging articles to be processed close to the air outlet port of each filter unit such that air is supplied to the articles to be processed after the air has passed through the corresponding filter units.

10 Claims, 7 Drawing Sheets

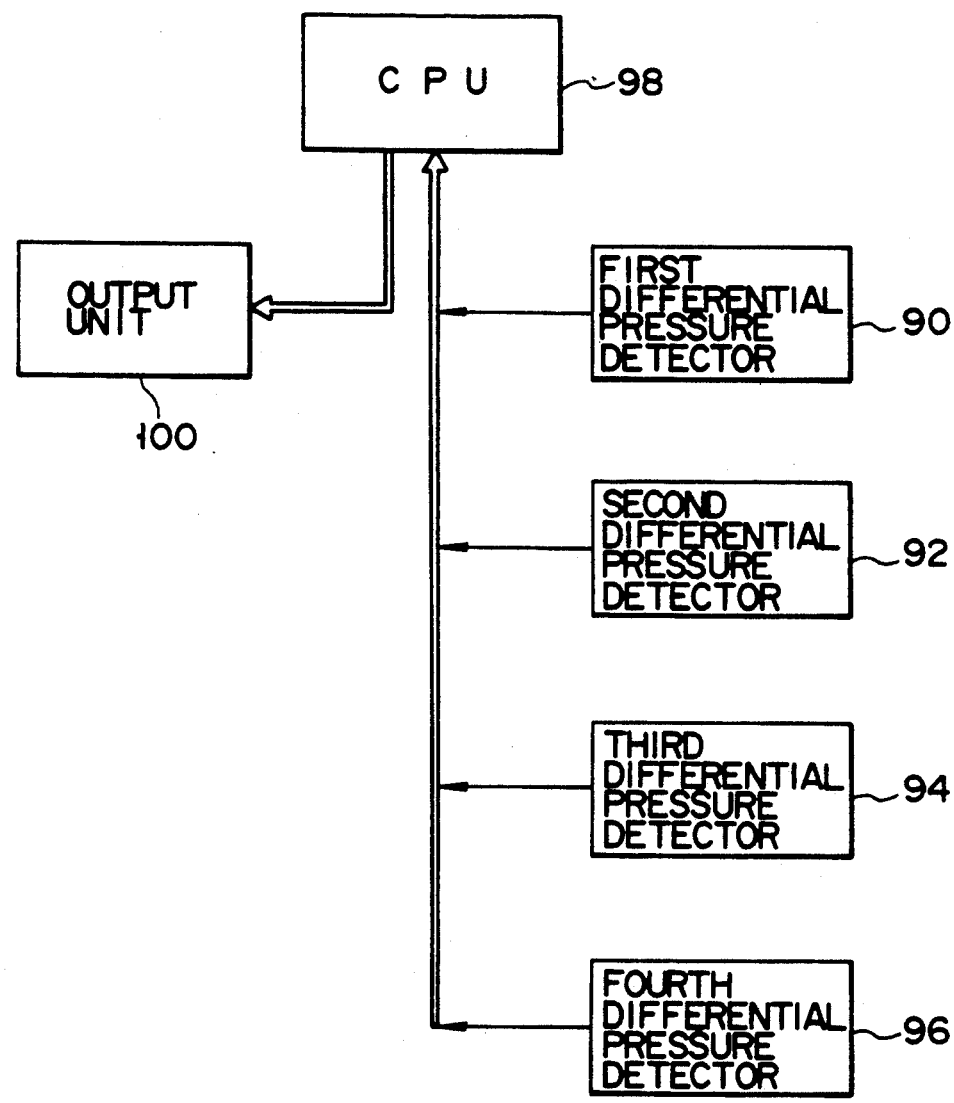
F I G. 8

APPARATUS FOR PROCESSING SEMICONDUCTORS

BACKGROUND OF THE INVENTION

1. Field of the Invention

This invention relates to an apparatus for processing semiconductors used in a manufacturing process of semiconductor elements.

2. Description of the Related Art

As semiconductor circuits have rapidly more highly integrated and more highly densified, semiconductors have been manufactured in a clean room in which a higher degree of cleanliness of air is maintained.

The productivity of semiconductor elements in semiconductor manufacturing lines in clean rooms greatly depends upon the nature of control of circumference such as the maintenance of the degree of cleanliness of air. In particular, the manufacture of highly integrated semiconductor devices requires the improvement of the degree of cleanliness of air in clean rooms.

Typical semiconductor processing apparatuses installed in clean rooms, such as heat treating apparatuses, CVD apparatuses and etching apparatuses, contain a plurality of filter units. Each filter unit has an air intake port from which air is taken in the clean room, an air blowing port from which air is supplied to articles to be processed and an air outlet port from which air is discharged as it is.

In this process, air is separately taken in the clean room from the air intake port of each filter unit. This causes the problem that the amount of air more than required is used. Further, air is supplied from the air blowing port of each filter unit to the articles to be processed and is discharged in the clean room in a state in which air which has passed the region on the articles to be processed and contains dirt and/or poisonous gases. This lowers the degree of cleanliness of air in the clean room. This conventional apparatus, therefore, is encountered with the problem that the cleanliness of air in the clean room cannot be maintained.

SUMMARY OF THE INVENTION

The object of this invention is to provide a semiconductor processing apparatus with which the amount of air exhaustion in a clean room is suppressed to a minimum and clean air after having passed through a filter unit is directly supplied to articles to be processed such that air which has passed the region on the articles to be processed and whose degree of cleanliness is lowered is not directly supplied to the articles to be processed again whereby the quality of the processed articles is improved.

The object of this invention is attained by a semiconductor processing apparatus comprising a main body having an air passage; a plurality of filter units connected in series with the air passage in the main body, each filter unit having an air intake port, an air outlet port and air blowing means, the air intake port of each filter unit communicating with the air outlet ports of the filter units disposed upstream side of the air passage; and means for arranging articles to be processed close to the air outlet port of each filter unit such that air is supplied to the articles to be processed after the air has passed through the corresponding filter units.

The object of this invention is further attained by a filter device which comprises a first filter provided in a semiconductor processing apparatus having an air passage, the first filter having first blowing means, a first filter, an air intake port and an air outlet port; a second filter unit disposed in the air passage and downstream of the air blowing unit and having second blowing means and a second filter; and means for adjusting the amount of air supplied by the first and second blowing means so as to return, to the air intake port of the first filter unit, part of air supplied from the air outlet port of the first filter.

In the apparatus according to this invention, a plurality of filter units are arranged in series, air is taken in a main body of the apparatus, clean air is blown out from the first filter unit, the clean air is directly supplied to articles to be processed, and the air which has passed a region on the articles to be processed is caused to flow in the next filter unit. Air is circulated through the air intake port and the air outlet port of each filter unit, and clean air which has passed through the filter unit is supplied to the articles to be processed which are arranged close to the air outlet port of each filter unit.

With this apparatus, the amount of air exhaustion is reduced to a minimum so as to retain the degree of cleanliness of air in a clean room and the quality of processed articles is improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 8 is a block diagram of a pressure detector provided in the filter units.

DETAILED DESCRIPTION OF THE PREFERRED EMBODIMENTS

This invention will now be explained by way of an embodiment in a form of a vertical heat treating apparatus as a semiconductor processing apparatus with reference to the accompanying drawings.

Figure 1:
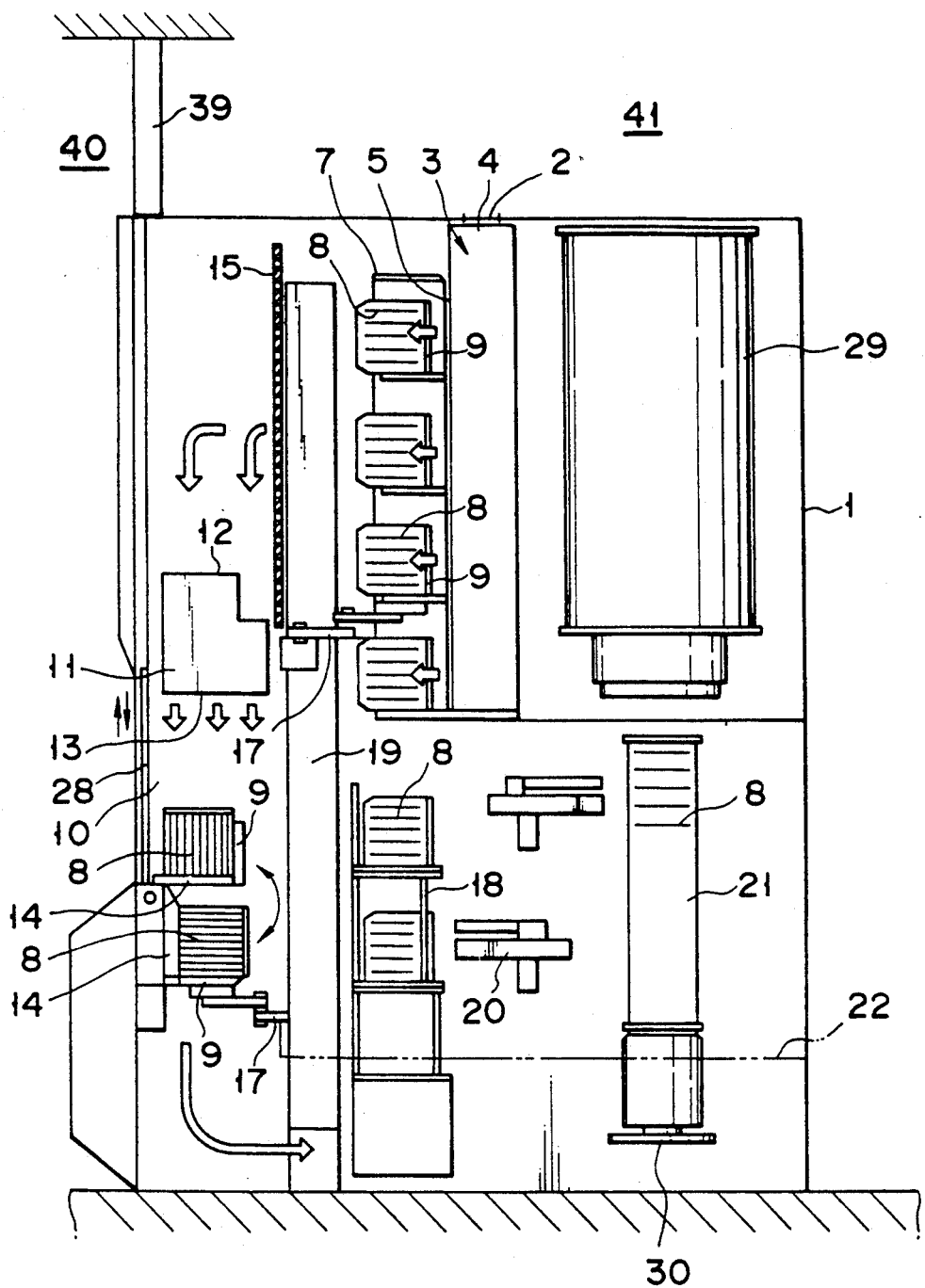
FIG. 1 is a schematic view of the internal structure of a vertical heat treating apparatus which is an embodiment of a semiconductor treating apparatus according to this invention.

As shown in FIG. 1, a vertical heat treating apparatus according to an embodiment of this invention has a main body 1 of the apparatus, most part of which is housed in a maintenance room 41. The front portion of the main body 1 is inserted in a clean room 40 separated from the maintenance room 41 by means of a partition wall 39.

In the front face of the main body 1 is provided auto doors 28 through which carriers 9 each supporting a plurality of (25, for example) disc-shaped semiconductor wafers 8 are carried in the main body 1 and out therefrom. When carried in the main body 1 and out therefrom, the wafers 8 are inserted in wafer receiving grooves (not shown) formed in a carrier 9 so as to take a vertical position.

Figure 3:
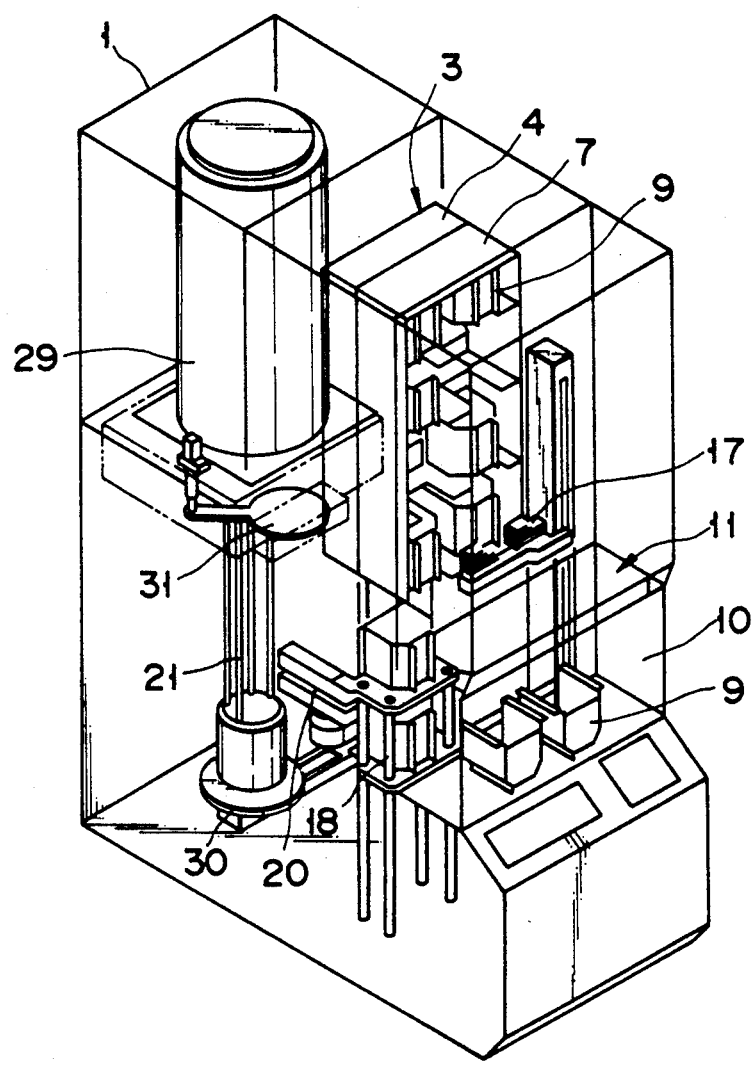
FIG. 3 is a perspective view of the internal structure of the vertical heat treating apparatus.
Figure 4:
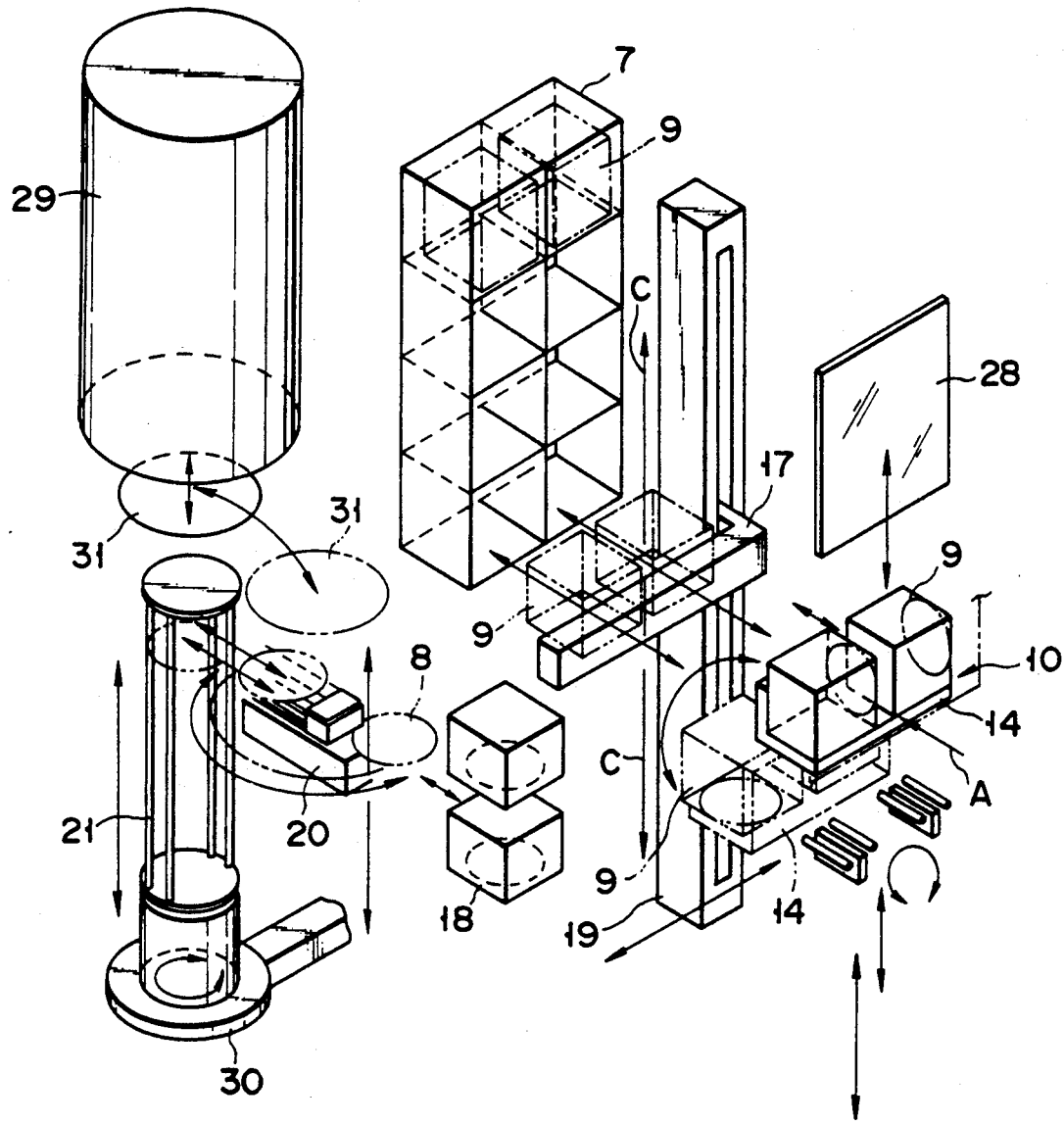
FIG. 4 is a perspective view showing the operation of the movable portions of the vertical treating apparatus of FIG. 3.

Referring to FIGS. 3 and 4, the carriers 9 which have been carried in the main body 1 as shown by an arrow A are loaded on an I/O port 10 (which can load two carriers 9, for example, at a time). Above the I/O port 10 is provided a carrier stage 7 which can hold a plurality of carries 9 (in this embodiment, 8 carriers arranged in two rows and in four steps) such that the carries 9 are moved by an elevator 19 in directions C so as to be carried in the main body 1 and out therefrom.

A heat treating furnace 29 which heat-treats wafers 8 is provided in the rear upper portion of the main body 1. A wafer boat 21 made of heat-resistive material such as quartz is loaded in and out from the heat treating furnace 29 by means of a boat elevator 30. An openable shutter 31 for insulating heat in the heat treating furnace 29 is provided in the lower portion of the heat treating furnace 29.

The I/O port 10 contains a position changing mechanism 14 which turns through substantially 90° the carriers 9 holding semiconductor wafers 8 arranged in the lengthwise direction. The carriers 9 are transported by a carrier transfer 17 and the elevator 19 to the carriage stage 7 or a transfer stage 18. The wafers 8 in the carriers 9 transported to the transfer stage 18 are moved to the wafer boat 21 by means of a wafer transfer 20. In this case, the carriers 9 moved in the carrier stage 7 hold the wafers 8 horizontally, and the wafers 8 are transferred between the wafer boat 21 and the carriers 9 also in a horizontal manner.

Figure 2:
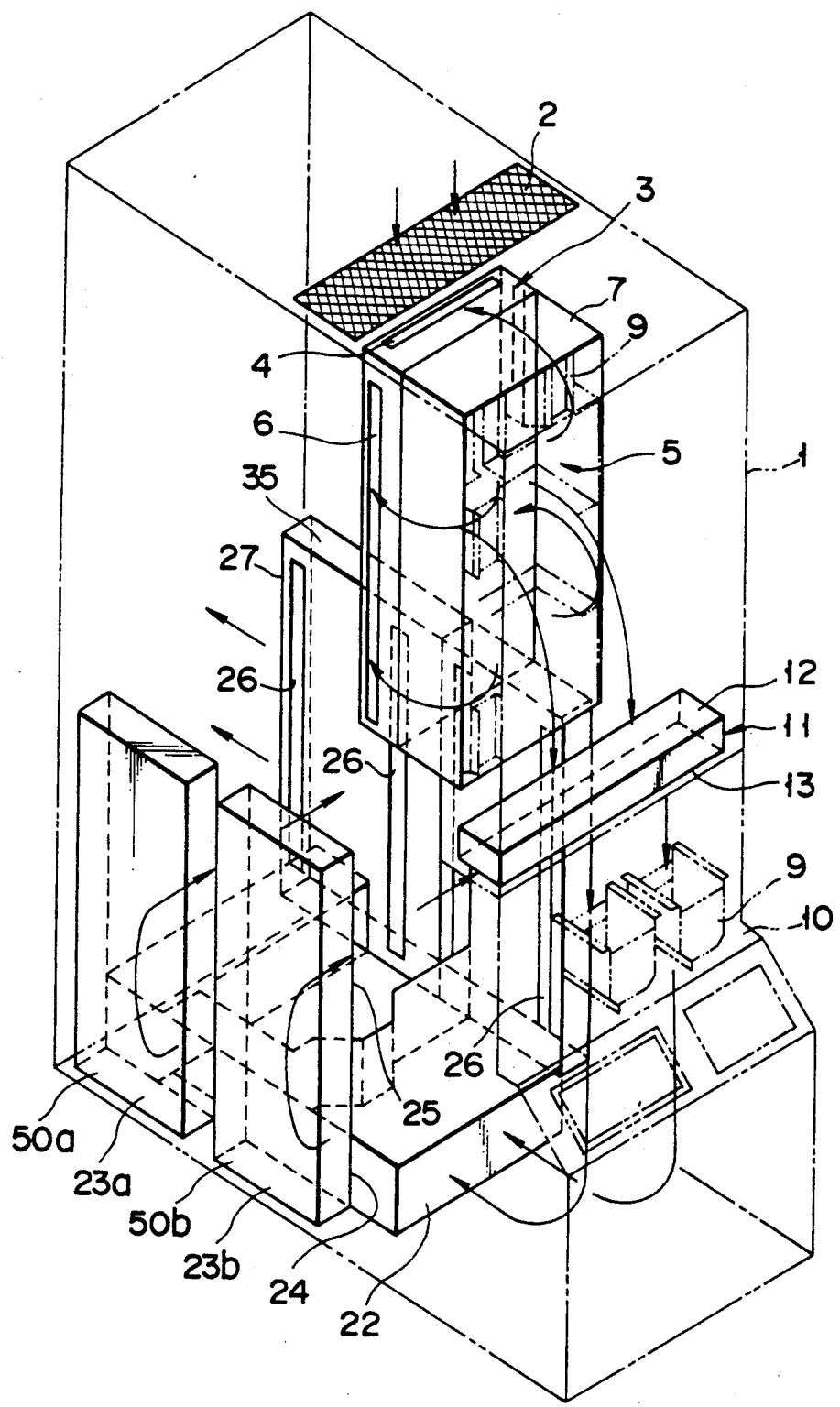
FIG. 2 is a perspective view of a filter unit of this embodiment.

As shown in FIG. 2, a meshed air inlet port 2 is formed in the central top portion of the main body 1 and an elongated first filter unit 3 is provided close to the air inlet port 2. The unit 3 is formed in its upper surface with an air intake port 4 and in its front face with an air outlet port 5. The air outlet port 5 has an air blowing-out area of S1 such that clean air forms a side flow on all the wafers 8 horizontally held in the carriers 9.

The second filter unit 11 has such an air blowing-out area S2 that clean air forms a down flow on all the wafers 8 held vertically in two carriers 9 on the I/O port 10. The areas are set such that S1:S2=4:1.

Figure 5:
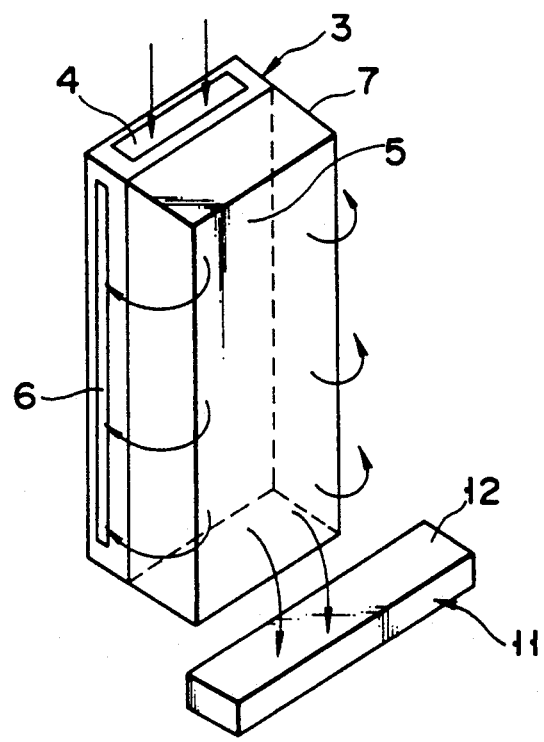
FIG. 5 is a perspective view illustrating air flows at a first filter unit and a second filter unit.
Figure 6:
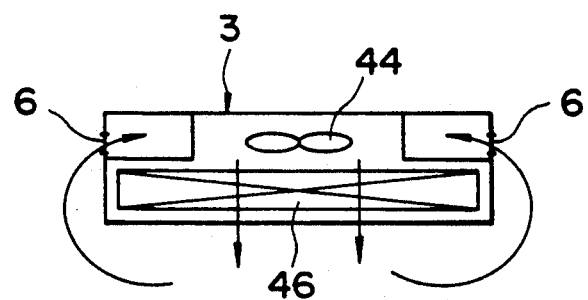
FIG. 6 is a view depicting the internal structure of the first filter unit of FIG. 5.

The first filter unit 3 is provided at one side thereof with an air return port 6 whose width is widened more and more as the position is lowered, as shown in FIG. 5 and houses a filter 46 and an air fan 44, as shown in FIG. 6.

When the taken-in amount of air by the air intake port 4 provided in the first filter unit 3 is larger than the discharged amount of air from the air outlet port 5 provided in the first filter unit 3, part of the discharged clean air returns to the air return port 6 of the filter unit 3 and is discharged from the air outlet port 5 again. It follows, therefore, that the taken-in amount of air from the air intake port 4 and the discharged amount of air from the air outlet port 5 are substantially equal to each other, and blown-out air flows in a stable, laminated manner.

The air intake port 4 and the air return port 6 are provided with dampers for adjusting air flows such that each damper is designed to suitably adjust the flow ratio between the air intake port 4 and the air return port 6.

On the front face of the first filter unit 3 as shown in FIG. 1 is provided the carrier stage 7 which contains the carriers 9 on which a plurality of semiconductor wafers 8 are arranged in parallel with the direction of the air discharge. In front of the carrier stage 7 is disposed a air blowing control plate 15 formed with a great number of small holes defining an opening ratio of substantially 20%. Pressure is lowered at the front side of the air blowing control plate 15 and air which has passed through the holes is reduced in its speed to be sent forward, whereby air is prevented by the air control plate 15 from staying between the carrier stage 7 and the main body 1 and being blown unevenly.

The air which has passed the carriers 9 and the air blowing control plate 15 is taken in from the air intake port 12 of the second filter unit 11 provided close to the I/O port 10 of the main body 1, and clean air is blown out from the air outlet port 13 of the second filter unit 11

As shown in FIG. 1, the air outlet port 13 of the second filter unit 11 is opened wide such that clean air discharged from the air outlet port 13 forms an air curtain. External air is hindered from flowing from the I/O port 10 into the main body 1.

In the lower portion of the main body 1 is provided a lower duct 22 into which flows air passing the region on the wafers 8 held in the carriers 9. As shown in FIG. 2, on a side wall of the lower portion of the main body 1 are provided third filter units 23a and 23b each having an air intake port 24 and an air outlet port 25. Clean air taken in from the lower duct 22 is sent out laterally of the main body 1 from the air outlet port 25 through the air intake port 24 and is supplied laterally in a laminated state to the wafer boat 21 disposed close to the air outlet ports 25 of the third air filter units 23a and 23b.

In the opposite side wall of the lower portion of the main body 1 are formed side ducts 35 having air intake ports 26 disposed opposite to the air outlet ports 25 of the third filter units 23a and 23b. The side duct 35 is formed with an air discharging port 27 opened to the maintenance room 41. Air which has passed the region on the wafer boat 21 flows in from the air intake port 26 of the side duct 35 and is discharged from the air discharging port 27.

The operation of the embodiment of the semiconductor processing apparatus will now be explained.

As illustrated by the air flows in the directions indicated by the arrows in FIG. 2, air introduced from the air inlet port 2 of the main body 1 flows in the first filter unit 3 provided in the main body 1. In the first filter unit 3, the amount of discharged air from the air outlet port 5 is larger than the amount of taken-in air from the air intake port 4. Part of clean air blown out from the air outlet port 5 is returned to the air return port 6 of the filter unit 3 and then discharged from the air outlet port 5 again. Clean air flows out from the air outlet port 5 in a stable, laminated state and is supplied to the wafers in the carriers 9 arranged close to the air outlet port 5.

Air which has passed on the wafers is taken in from the air intake port 12 of the second filter unit 11 provided above the I/O port 10 of the main body 1 and then discharged from the air outlet port 13. The clean air discharged from the air outlet port 13 is supplied to the wafers arranged in a longitudinal direction in the carriers 9.

The air which has passed on the I/O port 10 flows in the lower duct 22 formed in the lower portion of the main body 1 and then in the air intake ports 24 of the third filter units 23a and 23b. Clean air blows out from the air outlet ports 25 of the third filter units 23a and 23b to be laterally supplied in a laminated state to the wafer boat 21 disposed close to the air outlet ports 25. In other words, clean air is supplied to the wafers 8 arranged laterally on the wafer boat 21.

The air which has passed on the wafer boat 21 flows in the air intake port 26 of the side duct 35 and discharged from the air discharging port 27 into the maintenance room.

Accordingly, the formation of air flow in the main body of the apparatus reduces the amount of taken-in air and maintains the degree of cleanliness of air in the clean room.

The filter unit of the embodiment will now be explained.

Figure 7:
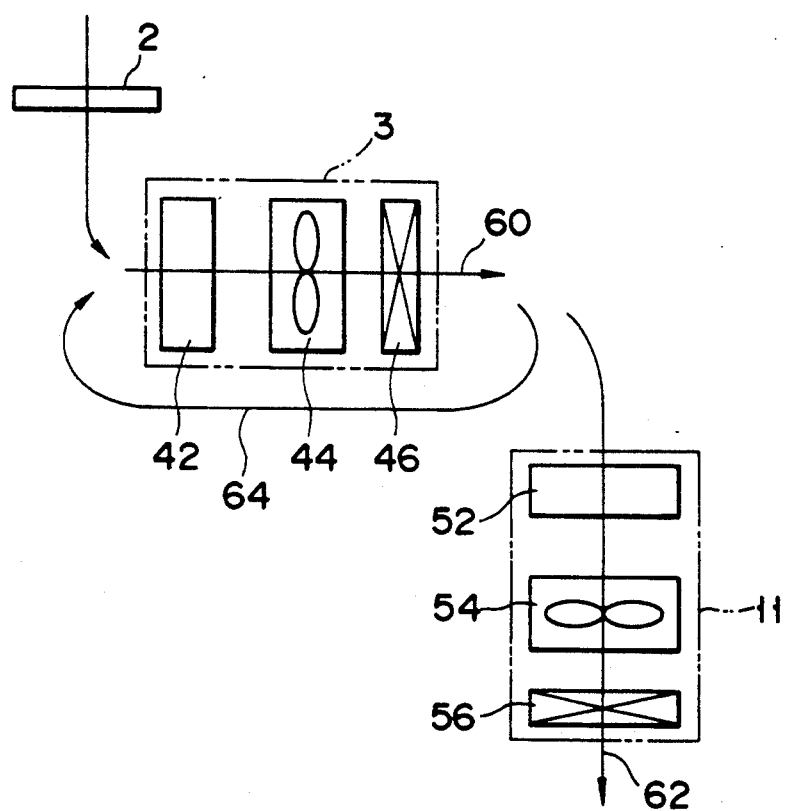
FIG. 7 is a schematic view explaining air flows at the first and second filter units.

As shown schematically in FIG. 7, the first and second filter units 3 and 11 comprise dampers 42 and 52 for adjusting the amounts of taken-in air, respectively, blowers 44 and 54 provided with centrifugal multiblade type fans (sirrocco fans) for blowing air, and air filters 46 and 56 for removing dust from air and sending it out as clean air. The amount of taken-in air by the dampers 42 and 52 and the amount of air sent out by the blowers 44 and 54 are selected to set the speed of clean air preferably to 0.3 m/sec at a position separated by a predetermined distance (10 cm, for example) from the air blowing-out surface of the filters 46 and 56.

Since the first and second filter units 3 and 11 are provided at an upstream portion and a downstream portion of the clean air passages, respectively, clean air which has blown out from the first filter unit 3 in a form of a side flow 60 is taken in the second filter unit 11 and flows as a down flow 62 through the second filter unit 11. In this case, part of the clean air blown out from the first filter unit 3 does not enter the second filter unit 11 but is returned to the upstream side of the first filter unit 3 along a return passage 64.

In the embodiment, the area ratio of the filter 46 to the filter 56 is set to S1:S2=4:1, and the air discharging ratio of the filter 46 to the filter 56 is set to Q1:Q2=4:1. In this connection, ¾ of the total amount of air discharge from the filter 4 is returned, and thus the amount of clean air taken in from the outer atmosphere of the apparatus through the air inlet port 2 is ¼ of the total amount of air discharge, resulting in the reduction of the amount of taken-in air.

In this arrangement, the dampers 42 and 52 and the blowers 44 and 54 can be adjusted when the apparatus is set such that a side flow and a down flow are smoothly formed at a predetermined speed without generating turbulence.

The provision of the return passage 64 in this embodiment enables clean air to be sent out from each filter unit at a required speed even if the air discharging areas S1 and S2 of the filter units 3 and 11 differ from each other.

Clean air flows on the carriers 9 in the following order. First, a down flow 62 is formed on the carriers 9 when the carriers 9 are transported through the auto doors 28 onto the I/O port 10. Then, a side flow 60 is formed when the carriers 9 are loaded on the carrier stage 7. Thereafter, the air passes through the air filter 56 and the air flow is changed from the side flow 60 to a down flow 62 to cause the filtered air to flow on the carriers 9 again. Since the first down flow makes the carriers 9 in the carrier stage 7 relatively clean, the filter 56 is less contaminated when the air flow changed from the side flow 60 to the second down flow 62 is used.

The control system of the filter units will now be explained.

The vertical heat treating apparatus of this embodiment has the third filter units 23a and 23b as well as the first and second filter units 3 and 11. The third filter units 23a and 23b are provided at such positions that, as shown in FIG. 2, a side flow is formed on wafers 8 horizontally held in the wafer boat 21 both before the wafer boat 21 is loaded and after the wafer boat 21 has been unloaded. Two doors 50a and 50b through which operators enter the main body 1 in order to maintain it are provided on the lower portion of the main body 1. The third filter units 23a and 23b are mounted in the doors 50a and 50b.

In this embodiment is provided a monitoring system for monitoring the operation of the firs, second and third filter units 3, 11, 23a and 23b. As shown in FIG. 8, these filter units 3, 11, 23a and 23b contain first, second, third and fourth differential pressure switches (pressure detectors or pressure devices) 90, 92, 94 and 96 for detecting pressures (such as the differences between the pressures at the filter units and the atmospheric pressure) of air fans of the corresponding filter units 3, 11, 23a and 23b. A CPU 98 receives input signals from the switches 90 to 96 and outputs information from the filter units 3, 11, 23a and 23b to an output unit 100 such that the information is displayed or represented in a form of sounds.

When the first, second and third air filter units 3, 11, 23a and 23b are not so contaminated in case the air fans are rotated at a set speed, the pressures of the air fans are always higher than the predetermined pressure. When the air fans are troubled, the pressures of the air fans decrease. With the monitoring system as described above, when the pressure of any air filter unit becomes lower than the predetermined pressure, the differential pressure switch 90, 92, 94 or 96 of said any air filter unit sends a signal to the CPU 98 and outputs the same, whereby it is detected that the filter unit is in an abnormal state. Accordingly, the monitoring system facilitates the central control of the air filter units.

In order to obtain such information that the air filters are contaminated from the filter units, more than two differential switches operating at different pressure differences (5 mmH$_2$O, 0.4 mmH$_2$O, etc.) may be prepared for each filter unit.

This invention is not only applied to a vertical heat treating apparatus for a semiconductor manufacturing device but to various apparatuses in which clean air flows are formed in at least two portions. This invention is also applicable to apparatuses installed in a clean room and provided with a plurality of filter units, such as a CVD apparatus and an etching apparatus. It is preferred that each filter unit has at least a filter and air blowing means selected from various types.

In the embodiment, the air discharging areas of the filters prepared in the different steps are different from each other, but may be made equal to each other. In this case, the amount of air taken in from the exterior of the main body of the apparatus can also be reduced.

This invention is not limited to the above-mentioned embodiment and modifications but is applicable to various modifications which are within the scope of this invention.

What is claimed is:

1. A semiconductor processing apparatus comprising:
   a main body having an air passage;
   at least first and second filter units connected in series to said air passage in said main body, said first filter unit having a first air outlet port, first air blowing means and a first air intake port structured so as to take, into said main body, air flowing inside a room in which said semiconductor processing apparatus is installed, said second filter unit being disposed downstream of said first filter unit and having second air blowing means, a second air outlet port and a second air intake port communicating with said first air outlet port of said first filter unit;
   exhausting means for exhausting air passed through said first and second filter units outside said main body; and
   means for arranging articles to be processed close to said air outlet port of each of said first and second filter units such that air is supplied to said articles to be processed after said air has passed through said first or second filter unit.

2. The semiconductor processing apparatus according to claim 1, wherein said first filter unit has an air return port structured so as to take air flowing into said main body therein, and said semiconductor processing apparatus comprises means for adjusting amounts of air supplied by said first flowing means so as to return air flowing from said first air outlet port of said first filter unit to said air return port.

3. The apparatus according to claim 1, wherein said exhausting means has an air exhausting duct and an air exhausting fan.

4. The apparatus according to claim 1, wherein each of said filter units has means for supplying air to both faces of said articles to be processed such as disc-like semiconductors in parallel therewith.

5. The apparatus according to claim 1, wherein said air blowing means has a centrifugal multi-blade type fan.

6. The apparatus according to claim 1, further comprising pressure detecting means for detecting a pressure at an air discharging side of each of said filter units, at least during operation of said blowing means.

7. The apparatus according to claim 1, further comprising air flow control means disposed in front of said air outlet ports of said filter units.

8. The apparatus according to claim 7, wherein said air flow control means has a plate formed with a great number of small holes having an opening ratio of substantially 20%.

9. A semiconductor processing apparatus comprising:
   a main body having an air passage;
   at least first and second filter units connected in series with said air passage in said main body, said first filter unit having a first air outlet port, first blowing means, a first air intake port structured so as to take, in said main body, air flowing inside a room in which said semiconductor processing apparatus is installed, and an air return port structured so as to take air flowing inside said main body therein, said second filter unit being disposed downstream of said first filter unit and having second blowing means, a second air outlet port and a second air intake port communicating with said first air outlet port of said first filter unit;
   means for adjusting amounts of air supplied by said first and second filter units so as to return air flowing from said first air outlet port of said first filter unit to said air return port;
   exhausting means for exhausting air passed through said first and second filter units outside said main body; and
   means for arranging articles to be processed close to said air outlet port of each of said first and second filter units such that air is supplied to said articles to be processed after said air has passed through said first filter unit or said second filter unit.

10. A semiconductor processing apparatus comprising:
    a main body having an air passage;
    at least first and second filter units connected in series to said air passage in said main body, said first filter unit having a first air outlet port, first blowing means and a first air intake port structured so as to take, into said main body, air flowing inside a room in which said semiconductor processing apparatus is installed, said second filter unit being disposed downstream of said first filter unit and having second blowing means and a second air intake port communicating with said first air outlet port of said first filter unit;
    exhausting means for exhausting air passed through said first and second filter units outside said main body; and
    moving means for moving articles to be processed, said moving means being arranged close to said air outlet port of each of said first and second filter units such that air is supplied to articles to be processed after said air has passed through said first filter unit or said second filter unit.

* * * * *